US012802936B2

(12) United States Patent
Park et al.

(10) Patent No.: US 12,802,936 B2
(45) Date of Patent: Nov. 17, 2026

(54) FREQUENCY GENERATION DEVICE FOR PROVIDING BIAS POWER IN SEMICONDUCTOR PROCESS

(71) Applicant: EN2CORE TECHNOLOGY, INC., Yuseong-gu (KR)

(72) Inventors: Se Hong Park, Seo-gu (KR); Yeonghoon Sohn, Yuseong-gu (KR); Dong Jegal, Hwaseong-si (KR); Jihoon Kim, Yuseong-gu (KR); Sae Hoon Uhm, Hwaseong-si (KR)

(73) Assignee: EN2CORE TECHNOLOGY, INC., Yuseong-gu (KR)

( * ) Notice: Subject to any disclaimer, the term of this patent is extended or adjusted under 35 U.S.C. 154(b) by 408 days.

(21) Appl. No.: 18/562,565

(22) PCT Filed: May 2, 2022

(86) PCT No.: PCT/KR2022/006247
§ 371 (c)(1),
(2) Date: Nov. 20, 2023

(87) PCT Pub. No.: WO2022/245011
PCT Pub. Date: Nov. 24, 2022

(65) Prior Publication Data

US 2024/0274406 A1 Aug. 15, 2024

(30) Foreign Application Priority Data

May 20, 2021 (KR) ........................ 10-2021-0065115

(51) Int. Cl.
*H02M 3/156* (2006.01)
*H01J 37/32* (2006.01)
*H03K 3/012* (2006.01)

(52) U.S. Cl.
CPC ...... *H01J 37/32155* (2013.01); *H01J 37/321* (2013.01); *H01J 37/32183* (2013.01); *H03K 3/012* (2013.01); *H01J 2237/334* (2013.01)

(58) Field of Classification Search
CPC ...................... H01J 37/32155; H01J 37/32183
See application file for complete search history.

(56) References Cited

U.S. PATENT DOCUMENTS 3,825,771 A * 7/1974 Boll ................. H03K 19/01728 326/119
5,394,061 A * 2/1995 Fujii ........................ H03H 7/40 315/111.21

(Continued)

FOREIGN PATENT DOCUMENTS

JP 2004103423 A 4/2004
JP 2008113473 A 5/2008

(Continued)

OTHER PUBLICATIONS

International Search Report and Written Opinion for PCT/KR2022/006247, dated Aug. 12, 2022, 11 pages.

(Continued)

*Primary Examiner* — Matthew J Daniels
(74) *Attorney, Agent, or Firm* — Ashurst Perkins Coie US LLP

(57) ABSTRACT

According to one embodiment of the present disclosure, a semiconductor process system could be provided, the system comprising a substrate holder where a substrate is placed and an electrode is included, and a frequency generating device providing bias power to the electrode, wherein the frequency generating device provides the bias power of different patterns to the electrode in a first period for performing a main process on the substrate and a second period for performing an auxiliary process on the substrate, (Continued)

and wherein at least one of the first period or the second period is adjusted to be 30 microseconds or smaller.

12 Claims, 10 Drawing Sheets

(56) References Cited

U.S. PATENT DOCUMENTS

| | | | | |
|---|---|---|---|---|
| 5,410,276 | A * | 4/1995 | Hwang | H03F 1/0244 330/297 |
| 5,662,819 | A * | 9/1997 | Kadomura | H01J 37/321 438/711 |
| 10,264,663 | B1 * | 4/2019 | Long | H01J 37/32174 |
| 10,448,495 | B1 * | 10/2019 | Dorf | H01J 37/32174 |
| 10,734,195 | B2 | 8/2020 | Long et al. | |
| 2011/0139748 | A1 * | 6/2011 | Donnelly | H01J 37/32174 216/37 |
| 2012/0302031 | A1 * | 11/2012 | Wu | H10P 50/283 438/711 |
| 2020/0105503 | A1 * | 4/2020 | Notomi | H01J 37/3211 |
| 2020/0203130 | A1 * | 6/2020 | Bhutta | H01J 37/32183 |
| 2020/0251345 | A1 * | 8/2020 | Yin | H01J 37/32082 |
| 2021/0082666 | A1 * | 3/2021 | Zhao | H01J 37/32183 |
| 2022/0189738 | A1 * | 6/2022 | Evans | H01J 37/32146 |

FOREIGN PATENT DOCUMENTS

| | | | |
|---|---|---|---|
| JP | 2020523739 | A | 8/2020 |
| KR | 20100004452 | A | 1/2010 |
| KR | 20160033034 | A | 3/2016 |
| KR | 20190048413 | A | 5/2019 |
| KR | 20210032420 | A | 3/2021 |
| WO | 2008050619 | A1 | 5/2008 |
| WO | 2020160497 | A1 | 8/2020 |

OTHER PUBLICATIONS

Notice of Allowance of Japanese Patent Application No. 2023-571463 issued on Nov. 19, 2024.

Written Opinion of the International Searching Authority of PCT/KR2022/006247 filed May 2, 2022, 10 pages.

* cited by examiner

| SWITCH / SWITCHING OPERATION | $S_1$ | $S_2$ | $S_3$ | $S_4$ | UNIT PULSE |
|---|---|---|---|---|---|
| FIRST SWITCHING OPERATION | On | Off | On | Off | ⊓ |
| SECOND SWITCHING OPERATION | Off | On | Off | On | ⊔ |
| THIRD SWITCHING OPERATION | On | On | Off | Off | — |
| FOURTH SWITCHING OPERATION | Off | Off | On | On | — |

FIG. 6

FREQUENCY GENERATION DEVICE FOR PROVIDING BIAS POWER IN SEMICONDUCTOR PROCESS

CROSS-REFERENCE TO RELATED APPLICATION

The present application is a 371 of International Application No. PCT/KR2022/006247, filed May 2, 2022, which claims Paris Convention priority of Korean Patent Application No. 10-2021-0065115, filed on May 20, 2021, the entire contents of which is incorporated herein for all purposes by this reference.

BACKGROUND OF THE INVENTION

Field of the Invention

The present disclosure relates to a frequency generator capable of providing bias power in a field of a semiconductor process. Particularly, the present disclosure relates to a radio frequency (RF) generator capable of providing bias power using a specific method in order to improve an etching rate or an etching speed in a plasma etching semiconductor process among manufacturing processes.

Description of the Related Art

Among semiconductor manufacturing processes, an etching process is a process of removing an unnecessary portion of a patterned substrate from the patterned substrate. The etching process is broadly classified into wet etching using a solution and dry etching using plasma. In recent years, in most cases, drying etching, that has an advantage for a fine patterning, has been used in order to meet the requirement of decreasing the size of a semiconductor.

The main variables in the etching process are etching speed (or an etching rate), uniformity, selectivity, and the like. Today, research is actively being conducted on improving process efficiency by increasing these main variables.

As one of methods of increasing the above-described variables, there has been proposed a method of providing bias power with a short period in order to efficiently dispose of a by-product resulting from the etching process. However, an RF generator currently used in the etching process has the structural problem of having difficulty in providing the bias power with a short period.

Therefore, there is a need for a RF generator with a novel structure for providing the bias power with a shorter period than in the related art in order to increase values of the above-described variable in the etching process.

The foregoing is intended merely to aid in the understanding of the background of the present disclosure, and is not intended to mean that the present disclosure falls within the purview of the related art that is already known to those skilled in the art.

SUMMARY OF THE INVENTION

An objective of the present disclosure is to provide an RF generator capable of providing electric power with a short period to a load.

Another objective of the present disclosure is to provide an RF generator capable of realizing bias power with a plurality of unit pulses to be provided to a load.

Still another objective of the present disclosure is to provide an RF generator capable of providing different bias power to a load during a pulse-on period and a pulse-off period, but controlling the pulse-on period and the pulse-off period in such a manner as to have different lengths.

Still another objective of the present disclosure is to provide an RF generator capable of controlling a driving frequency of power, which is output to a load, in order to supply the power to the load with a short period.

Still another objective of the present disclosure is to provide an RF generator capable of providing bias power that varies according to the etching time in an etching process.

Still another objective of the present disclosure is to provide an RF generator capable of controlling a period or duty cycle (duty ratio) of bias power to be applied to a load according to the extent of etching (etch depth) and to the time that elapses from a starting point in time for etching in an etching process.

The present disclosure is not limited to the above-mentioned objectives. From the present specification and the accompanying drawings, an objective not mentioned above would be understandable to a person of ordinary skill in the art to which the present disclosure pertains.

According to one embodiment of the present disclosure, there can be provided a system for semiconductor process, comprising: a substrate holder including an electrode; and a frequency generator configured to provide bias power to the electrode; wherein the frequency generator comprises: a power source, an inverter comprising at least one transistor, the inverter configured to receive DC power from the power source and provide the bias power during a main process period or an auxiliary process period, and a controller configured to provide a control signal to the transistor of the inverter, and wherein the controller is further configured to: provide the control signal to the transistor according to processing progress for a substrate placed on the substrate holder, and adjust a length of at least one of the main process period or the auxiliary process period less than 30 microseconds.

According to another embodiment of the present disclosure, an RF generating device is provided, the RF generating device comprising: a power source; an inverter configured to receive DC power from the power source and provide bias power to a load during a main process period or an auxiliary process period, the inverter comprising a switch unit; and a controller configured to provide a control signal to the switch unit of the inverter; wherein the controller is configured to: perform a first switching operation controlling the switch unit such that the inverter controlling the switch unit such that the inverter outputs a negative voltage, or a third switching operation controlling the switch unit such that the inverter outputs a zero voltage, perform the first switching operation and the second switching operation alternatively during the main process period, perform at least one of the first switching operation, the second switching operation, or the third switching operation during the auxiliary process period, and control the inverter such that the main process period and the auxiliary process period are alternatively repeated, and wherein a total time that the third switching operation is performed during the auxiliary process period is equal to or more than a half of a length of the auxiliary process period.

The present disclosure is not limited to the above-mentioned solutions, and from the present specification and the accompanying drawings, a solution not mentioned above would be understandable to a person of ordinary skill in the art to which the present disclosure pertains.

According to the present disclosure, a frequency of power to be applied to a load can be precisely controlled.

According to the present disclosure, the time taken to etch a substrate in an etching process and the time taken to release a by-product resulting from the etching can be efficiently controlled.

According to the present disclosure, an etching speed can be increased in the etching process, and thus the time taken for the etching process can be shortened.

The present disclosure is not limited to the above-mentioned effects. From the present specification and the accompanying drawings, an effect not mentioned above would be understandable to a person of ordinary skill in the art to which the present disclosure pertains.

BRIEF DESCRIPTION OF THE DRAWINGS

FIG. 6 is a view illustrating a switching operation that is performed by a controller according to an embodiment of the present disclosure;

DETAILED DESCRIPTION OF THE INVENTION

Figure 1:
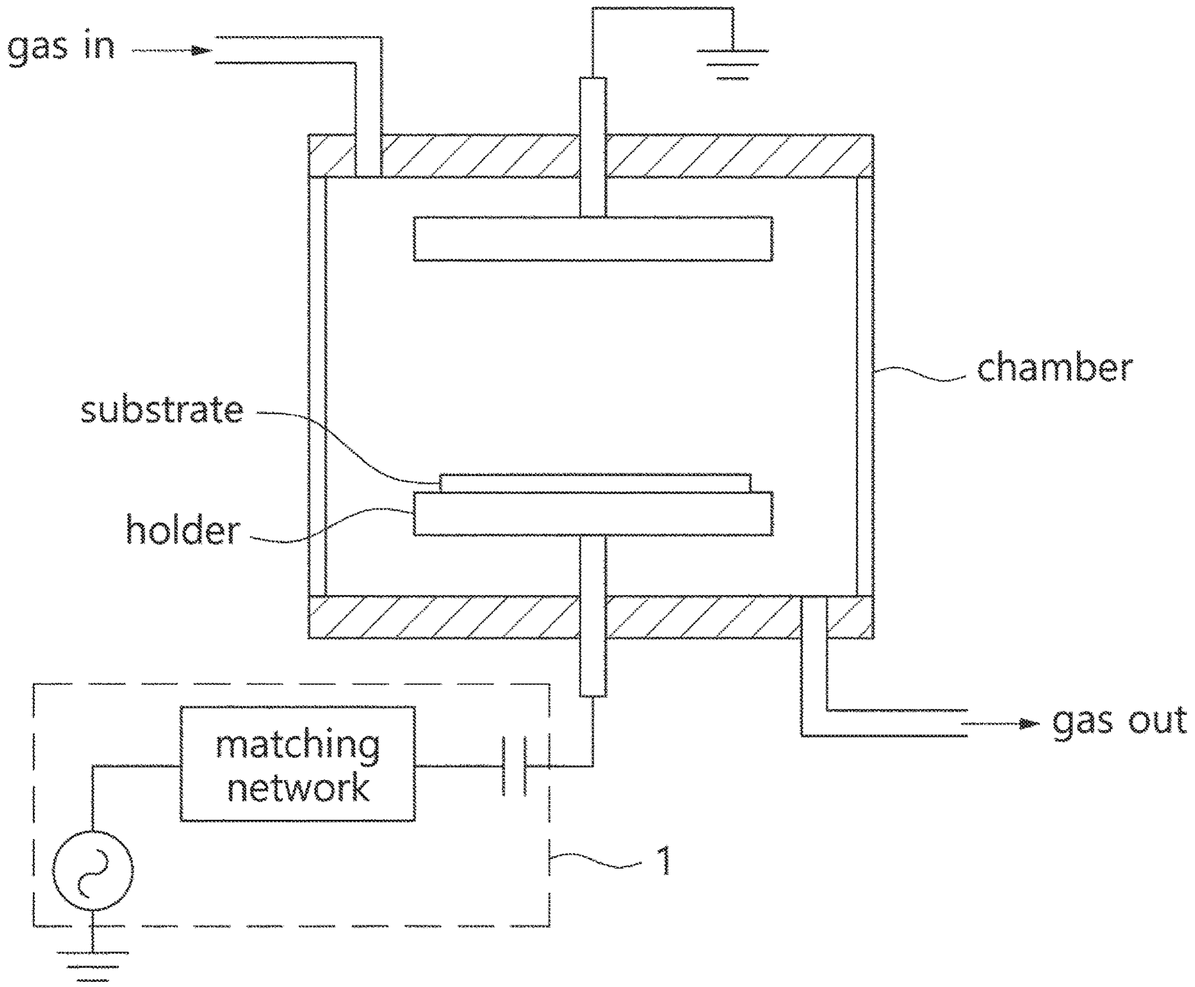
FIG. 1 and FIG. 2 are views illustrating a plasma etching system and bias power applied to the plasma etching system in the related art.

According to one embodiment of the present disclosure, a system for semiconductor process is provided, the system comprising: a substrate holder including an electrode; and a frequency generator configured to provide bias power to the electrode; wherein the frequency generator comprises: a power source, an inverter comprising at least one transistor, the inverter configured to receive DC power from the power source and provide the bias power during a main process period or an auxiliary process period, and a controller configured to provide a control signal to the transistor of the inverter, and wherein the controller is further configured to: provide the control signal to the transistor according to processing progress for a substrate placed on the substrate holder, and adjust a length of at least one of the main process period or the auxiliary process period less than 30 microseconds.

The inverter further comprises a first to fourth transistors, wherein the first transistor and the second transistor are connected in series through a first node, the third transistor and the fourth transistor are connected in series through a second node, the first node is electrically connected to one end of the electrode, and the second node is electrically connected to other end of the electrode.

The controller is configured to perform: a first switching operation which is providing a switch-on signal to the first transistor and the third transistor and providing a switch-off signal to the second transistor and the fourth transistor, a second switching operation which is providing a switch-off signal to the first transistor and the third transistor and providing a switch-on signal to the second transistor and the fourth transistor, a third switching operation which is providing a switch-on signal to the first transistor and the fourth transistor and providing a switch-off signal to the second transistor and the third transistor, or a fourth switching operation which is providing a switch-off signal to the first transistor and the fourth transistor and providing a switch-on signal to the second transistor and the third transistor.

The controller is configured to: perform the first switching operation and the second switching operation alternatively during the main process period, perform at least one of the third switching operation or the fourth switching operation during at least part of the auxiliary process period, and control the inverter such that the main process period and the auxiliary process period are alternatively repeated, and wherein a total time that at least one of the third switching operation or the fourth switching operation is performed during the auxiliary process period is equal to or more than half of a length of the auxiliary process period.

A total time that the first switching operation is performed during the auxiliary process period is same as a total time that the second switching operation is performed during the auxiliary process period.

A length of the main process period and a length of the auxiliary process period are same.

A length of the auxiliary process period is shorter than a length of the main process period.

The controller is configured to control the inverter such that a length of the auxiliary process period increases after a predetermined time from a starting time point of etching process for the substrate.

The system further comprises: a sensor configured to detect an extent of etching for the substrate; wherein the controller is configured to: obtain etch depth information from the sensor, and when it is determined that an etch depth is more than a predetermined depth based on the etch depth information, control the inverter such that a length of the auxiliary process period increases.

The system further comprises: a chamber where the substrate holder is placed; and an RF (radio frequency) source configured to generate a plasma inside the chamber.

The semiconductor process includes etching process for the substrate, and wherein the processing progress for the substrate includes an etch depth.

According to another embodiment of the present disclosure, an RF generating device is provided, the RF generating device comprising: a power source; an inverter configured to receive DC power from the power source and provide bias power to a load during a main process period or an auxiliary process period, the inverter comprising a switch unit; and a controller configured to provide a control signal to the switch unit of the inverter; wherein the controller is configured to: perform a first switching operation controlling the switch unit such that the inverter controlling the switch unit such that the inverter outputs a negative voltage, or a third switching operation controlling the switch unit such that the inverter outputs a zero voltage, perform the first switching operation and the second switching operation alternatively during the main process period, perform at least one of the first switching operation, the second switching operation, or the third switching operation during the auxiliary process period, and control the inverter such that the main process period and the auxiliary process period are alternatively repeated, and wherein a total time that the third switching operation is performed during the auxiliary process period is equal to or more than a half of a length of the auxiliary process period.

The switch unit comprises a first to fourth transistors, wherein the first transistor and the second transistor are connected in series through a first node, the third transistor and the fourth transistor are connected in series through a second node, the first node is electrically connected to one end of the load, and the second node is electrically connected to other end of the load, wherein the first switching operation is providing a switch-on signal to the first transistor and the third transistor and providing a switch-off signal to the second transistor and the fourth transistor, wherein the second switching operation is providing a switch-off signal to the first transistor and the third transistor and providing a switch-on signal to the second transistor and the fourth transistor, wherein the third switching operation is providing a switch-on signal to the first transistor and the fourth transistor and providing a switch-off signal to the second transistor and the third transistor, or the third switching operation is providing a switch-off signal to the first transistor and the fourth transistor and providing a switch-on signal to the second transistor and the third transistor.

A total time that the first switching operation is performed during the auxiliary process period is same with a total time that the second switching operation is performed during the auxiliary process period.

A length of at least one of the main process period or the auxiliary process period is less than 30 microseconds.

A length of main process period and a length of auxiliary process period is less than 10 microseconds respectively.

The above-described objectives, features, and advantages of the present disclosure will be more apparent from the following detailed description with reference to the accompanying drawings. In addition, various modifications may be made to the present disclosure, and various embodiments of the present disclosure may be practiced. Therefore, specific embodiments will be described in detail below with reference to the accompanying drawings.

The specific embodiments in the present specification are described with sufficient detail to enable a person of ordinary skill in the art to which the present disclosure pertains to get a clear understanding of the nature and gist of the present disclosure. Therefore, the present disclosure is not limited to the embodiments described in the present disclosure. A modification or amendment example of the present disclosure that does not depart from the nature and gist of the present disclosure should be construed as falling within the scope of the present disclosure.

The drawings accompanying the present application serves to make the present disclosure easier to understand. The accompanying drawings are not to scale are not used to define the precise proportions of the elements shown in the drawings. Therefore, the present disclosure is not limited to the accompanying drawings.

A detailed description of a well-known function or configuration relating to the present disclosure is omitted when determined as obfuscating the nature and gist of the present disclosure. In addition, throughout the present specification, the terms first, second, and so on are used only to distinguish from one constituent element to another.

In addition, the terms "unit," "module", and "section that are used to name a constituent element in the present specification are used considering only the ease with which the present specification is written. The terms are not intended as having different special meanings or functions and thus may be used individually or interchangeably.

The present disclosure relates to a radio frequency (RF) generator (hereinafter referred to as an "RF generator") providing bias power in a plasma etching process.

Specifically, an RF generator according to an embodiment of the present disclosure may apply the bias power having a relatively shorter period than in the related art to a substrate holder supporting a substrate when etching is performed on the substrate in an etching process, among semiconductor manufacturing processes.

The bias power here, as described below, may mean electric power, voltage, or current that is applied to a load in such a manner that the etching is performed on the substrate or in such a manner as that a by-product resulting from etching the substrate is released.

Figure 2:
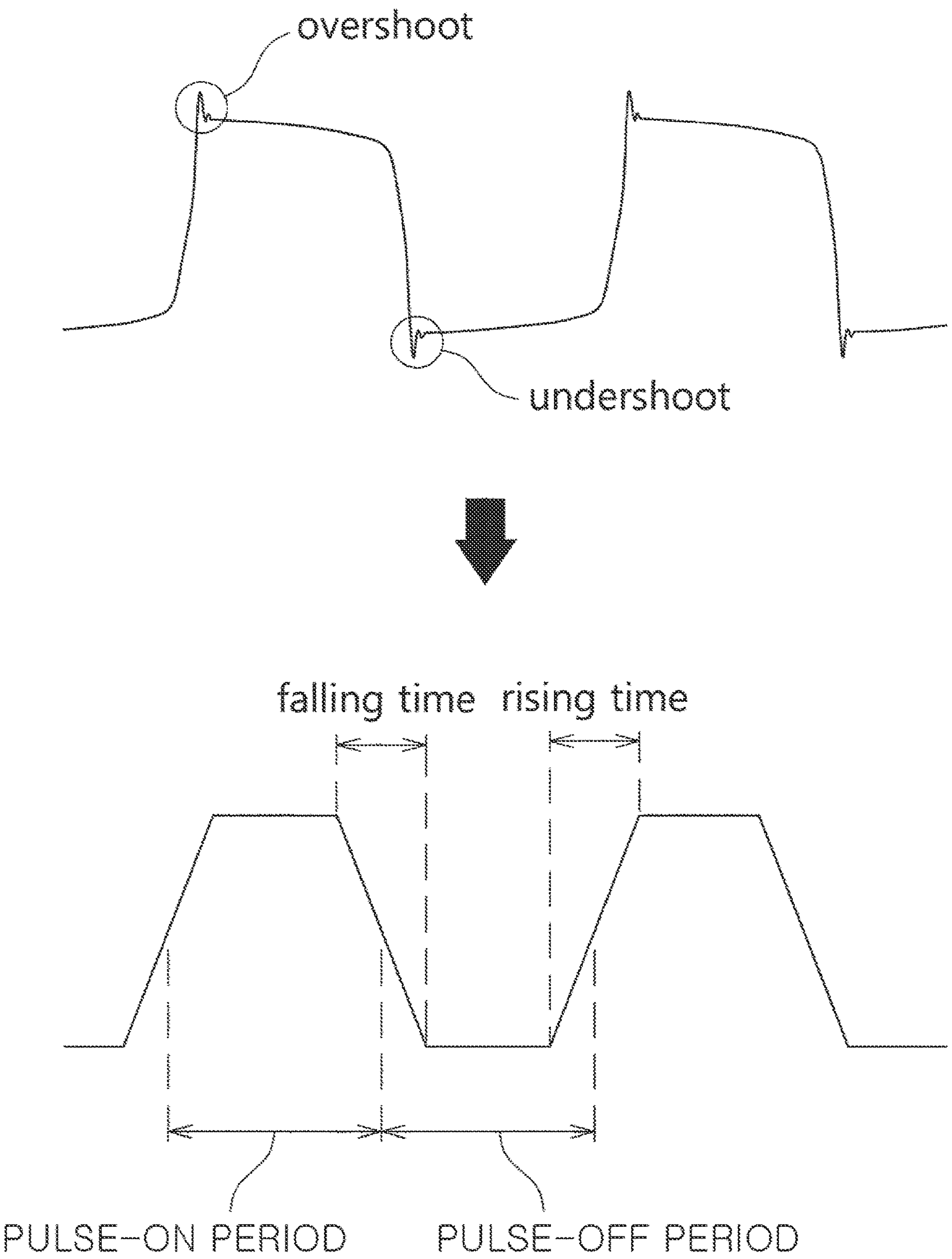

FIG. 1 and FIG. 2 are views illustrating a plasma etching system and the bias power that is applied to the plasma etching system in a related art.

With reference to FIG. 1, the plasma etching system may include a substrate, a holder supporting the substrate, a plasma generator for generating plasma, a chamber in which the substrate and the holder are arranged and in which includes a space in which the plasma is formed, an inlet port through which process gas used for etching is introduced, and an outlet port through which the process gas used for the etching is discharged.

The process of etching the substrate may be achieved by performing a step of inputting the process gas into the chamber, a step of supplying power to the plasma generator, a step of generating the plasma within the chamber, and a step of applying bias power to the holder supporting the substrate. Specifically, according to the bias power applied to the holder supporting the substrate, the process of etching the substrate may be achieved by performing a step of etching the substrate and a step of releasing the by-product are repeatedly performed.

The above-described bias power may be applied by a RF generator 1 in the related art. For example, the RF generator 1 in the related art is electrically connected to the holder supporting the substrate or to an electrode included in the holder supporting the substrate and thus may apply the bias power to the holder supporting the substrate or to the electrode included in the holder supporting the substrate.

The plasma generator in the plasma etching system may be realized in various ways. For example, the plasma generator may include an electrode that is arranged within the chamber. The plasma generator may be supplied with electric power from an external power supply unit and thus may generate the plasma within the chamber. As another example, the plasma generator may include a coil that is arranged outside of the chamber. The plasma generator may be supplied with power from the external power supply and thus may induce generation of the plasma within the chamber.

The RF generator 1 used in the etching process includes a matching network in order to reduce loss of electric power due to a difference in impedance between an output terminal of power supply unit included in the RF generator 1 in the related art and an input terminal of the holder supporting the substrate in a state where the RF generator 1 is electrically connected to the holder supporting the substrate. A frequency provided by the RF generator 1 in the related art is kept constant. For this reason, this matching network may be an essential constituent element in that there is no other method of reducing the difference in impedance due to connection to a load.

With reference to FIG. 2, as described above, the RF generator 1 in the related art may apply the bias power to the holder supporting the substrate during a pulse-on period and a pulse-off period in order to perform a plasma etching process. For example, the RF generator 1 in the related art may provide electric power corresponding to a high level, as the bias power, to the holder supporting the substrate during the pulse-on period in order to etch the substrate, and may provide the bias power corresponding to a low level to the holder supporting the substrate during the pulse-off period in order to release the by-product resulting from etching the substrate. More particularly, during the pulse-on period, the etching may be performed because ions resulting from the plasma within the chamber collide with the substrate or chemically react with the substrate. Furthermore, during the pulse-off period, the by-product resulting from the etching may be released outside of the substrate. The process of etching the substrate may be performed by reiterating the pulse-on period and the pulse-off period.

At this point, in a case where the RF generator 1 in the related art includes the matching network, the bias power that is applied to the holder supporting the substrate, as illustrated in FIG. 2, may have overshoot and undershoot. This overshoot or undershoot may cause damage to an internal constituent of the RF generator 1 in the related art or to a constituent of the plasma etching system. As the technique of solving this problem, as illustrated in FIG. 2, there is a method of preventing the overshoot and the undershoot by enabling the pulse-on period and the pulse-off period to have a rising time and a falling time. However, in this case, the pulse-on period and the pulse-off period are relatively lengthened. Thus, there occurs a problem in that efficiency in the etching process is decreased.

In order to alleviate the above-described problem and improve the efficiency in the etching process, an RF generator with a novel structure is necessary. This RF generator will be described in detail.

For convenience of description, an RF generator for applying the bias power in the plasma etching process will be described below. However, the technical idea of the present disclosure is not limited to this. At this point, it should be noted that the technical idea thereof can be applied to any technical fields that need RF power, such as the field of plasma generators, such as an inductively coupled plasma (ICP) apparatus and a capacitively coupled plasma (CCP) apparatus, the field of radio power transmission field, and the field of induction heating.

An RF generator 1000 according to an embodiment of the present disclosure will be described below with reference to FIG. 3.

Figure 3:
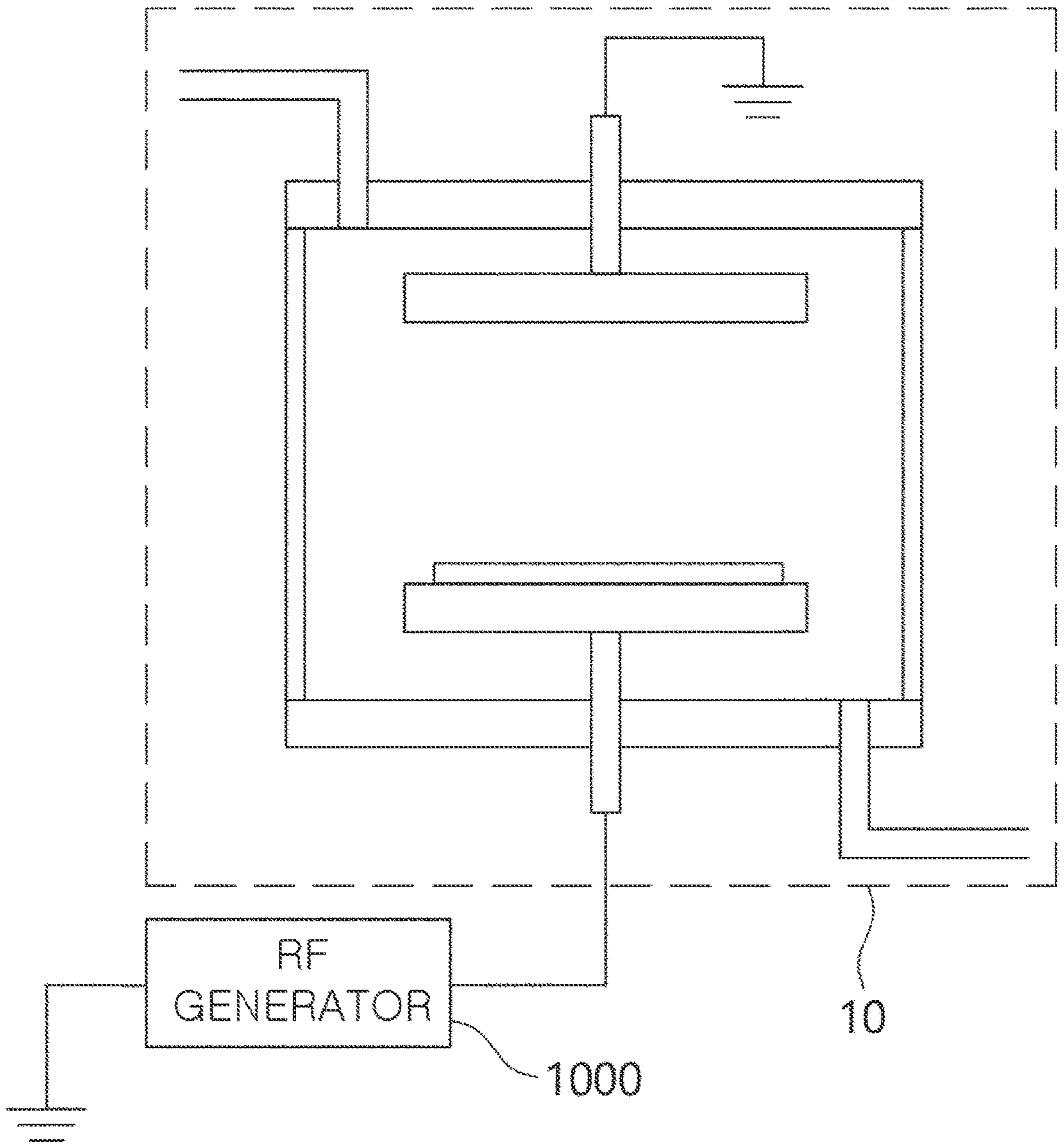
FIG. 3 is a view illustrating an RF generator and a plasma etching system according to an embodiment of the present disclosure.

FIG. 3 is a view illustrating the RF generator 1000 and a plasma etching system 10 according to another embodiment of the present disclosure. With reference to FIG. 3, the RF generator 1000 may be electrically connected to the plasma etching system 10 and thus may provide electric power.

The plasma etching system 10 is similar to the plasma etching system described with reference to FIG. 1, and therefore, a description thereof is omitted.

The RF generator 1000 may be electrically connected to a substrate support holder of the plasma etching system 10 and an electrode of the substrate support holder (hereinafter referred to as a "holder"). For example, an output terminal of the RF generator 1000 may be electrically connected to an input terminal of the holder.

The RF generator 1000 may provide the bias power to the holder. For example, as illustrated above, in the process of etching the substrate, the RF generator 1000 may apply the bias power corresponding to the high level to the holder during the pulse-on period in such a manner that the etching is performed on the substrate, and may apply the bias power corresponding to the low level to the holder during the pulse-off period in such a manner that the by-product is released. As another example, the RF generator 1000 may apply the bias power corresponding to the low level to the holder during the pulse-on period in such a manner that the etching is performed on the substrate and may apply the bias power corresponding to the high level to the holder during the pulse-off period in such a manner that the by-product is released. A method in which the RF generator 1000 provides the bias power will be in detail below.

The RF generator 1000 may be distinguished from an RF source connected to a component of the plasma etching system 10 other than the holder thereof. For example, the RF source may be connected to the holder to which the RF generator 1000 is connected or to an electrode opposite an electrode of the holder, and thus electric power for generating the plasma may be provided. As another example, the plasma etching system 10 may further include a radical generation apparatus for generating a radical necessary in the etching process, and the RF source may be included in the radical generation apparatus.

A configuration and structure of the RF generator 1000 will be described below with reference to FIG. 4.

Figure 4:
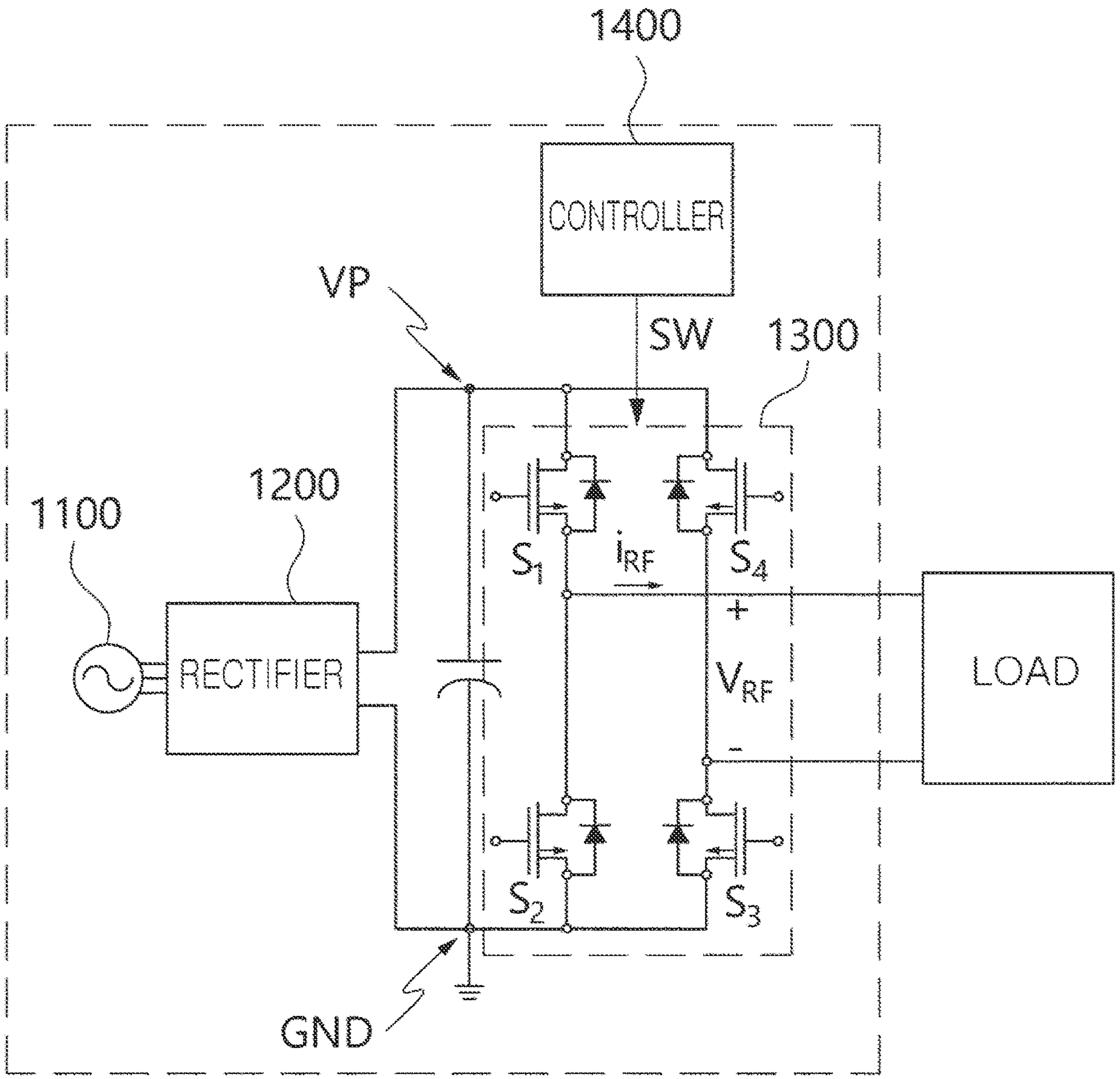
FIG. 4 is a view illustrating a configuration of the RF generator according to an embodiment of the present disclosure.

FIG. 4 is a view illustrating the configuration of the RF generator 1000 according to the embodiment of the present disclosure. With reference to FIG. 4, the RF generator 1000 may include a power supply unit 1100, a rectifier 1200, an inverter 1300, and a controller 1400.

The RF generator 1000 may convert alternating-current power supplied by the power supply unit 1100 and then may supply the resulting alternating-current power to a load. For example, the RF generator 1000 may convert alternating-current power used in a typical household or factory into alternating-current power of several or more kW at a frequency ranging from several hundreds kHz to several tens MHz and then may supply the resulting alternating-current power to the load. For convenience of description, the alternating-current power provided to the load is described as the bias power, but the technical idea of the present disclosure is not limited to the bias power.

The load may mean a component to which electric power is supplied. Examples of the load may include the above-described holder. As another example, the load may mean one of components including the substrate and the holder, which is connected directly or indirectly to the output terminal of the RF generator 1000. The load may have a particular impedance or a particular resonance frequency or may have a variable impedance or a variable resonance frequency that varies over time. For convenience of description, the load is described as the holder, but the technical idea of the present disclosure is not limited to the holder.

The rectifier 1200 may convert an output of the power supply unit 1100 into direct-current power. The rectifier 1200 may convert alternating-current power to be supplied to the power supply unit 1100 into direct-current power and then may apply the resulting direct-current power to the inverter 1300.

The inverter 1300 may be supplied with the direct-current power from the rectifier 1200 and then may supply the bias power to the holder. For example, the inverter 1300 may receive a switching signal SW from the controller 1400 and may provide the bias power to the load using the received switching signal SW. The inverter 1300 may include at least one switch element that is controlled with the switching signal SW. The switch elements may include a transistor, a diode, a capacitive element, and the like.

As an example, the inverter 1300 may include first to fourth switches S1, S2, S3, and S4, and thus may be realized as an inverter that is of a full bridge type. With reference to FIG. 4, the first switch S1 is connected in series to the second switch S2 through a first node, the third switch S3 is connected in series to the fourth switch (S4) through a second node, and the first node and the second node may be connected to the holder. The first to fourth switches S1, S2, S3, and S4 may receive the switching signal SW from the controller 1400 and may be turned on or turned off. Specifically, the switching signals SW may include a switch-on signal and a switch-off signal, the first to fourth switches S1, S2, S3, and S4 may be turned on when the switch-on signal is applied thereto and may be turned off when the switch-off signal is applied thereto. At this point, when the first and third switches S1 and S3 are turned on and the second and fourth switches S2 and S4 are turned off, a positive voltage may be applied to the holder. In addition, when the first and third switches S1 and S3 are turned off and the second and fourth switches S2 and S4 are turned on, a negative voltage may be applied to the holder.

A dead time during which the switching signal SW is not provided to all the switches may exist between the switch-on signal and the switch-off signal. The presence of the dead time between the switch-on signal and the switch-off signal may enable soft switching and thus may prevent the switch from being damaged.

A method of applying the switch signal SW of the inverter 1300 will be in more detail below.

As another example, the inverter 1300 may include the first switch S1 and the second switch S2 and thus may be realized as being of a half bridge type. At this point, the first switch S1 and the second switch S2 may be connected in series to each other through the first node, and the holder may be electrically connected to the first node. Thus, the bias power may be applied to the holder.

The inverter 1300 may include an inductive element in order to prevent the switching element from being damaged. For example, if a case where the inverter 1300, as described above, includes the first to fourth switches S1, S2, S3, and S4, the inverter 1300 may include an inductive load that is connected to the first node and the second node. As another example, in a case where the inverter 1300, as described above, is a half bridge type, the inverter 1300 may include the inductive load that is connected in series to the holder. Since the inverter 1300 includes the inductive load, the switch element within the inverter 1300 may be turned on or turned off when a voltage of between both ends of the switch element is approximately 0. Thus, the switch element can be prevented from being damaged.

The bias power that is supplied from the inverter 1300 to the holder may have a driving frequency that is set based on the switching signal SW that is provided by the inverter 1300 from the controller 1400.

According to a method in which the controller 1400 controls a frequency, the inverter 1300 may be controlled using the technique of time delay, the technique of pulse width modulation (PWM), the technique of a combination of time delay and pulse width modulation, or the like.

A capacitive element may be arranged between the rectifier 1200 and the inverter 1300. For example, the RF generator 1000 may include a capacitor that is connected in parallel to the rectifier 1200 and the inverter 1300. The capacitor may discharge to a ground node GND an alternating-current component of electric power that is applied to the inverter 1300.

The controller 1400 may control the inverter 1300. For example, the controller 1400 may perform control that provides the switching signal SW to the inverter 1300 in such a manner that the inverter 1300 provides the bias power to the holder. More specifically, through a switching operation described below, the controller 1400 may control a period, a waveform, a magnitude, a duty ratio, and/or the like of the bias power that provided to the holder. A method in which the controller 1400 controls the bias power to be provided to the holder using the inverter 1300 will be described in detail below.

The controller 1400 may be realized using the technology of a Field Programmable Gate Arrays (FPGA). In addition, in providing the switching signal SW, the controller 1400 may use a clock source having a preset clock frequency.

Although not illustrated in FIG. 4, the RF generator 1000 may further include a sensing unit. Thus, the controller 1400 may receive data obtained from the sensing unit and may generate the switching signal SW. For example, the controller 1400 may be realized in such as to acquire data associated with a resonance frequency, such as current, voltage, or the like of the holder, from the sensing unit and to generate the switching signal SW. Specifically, the controller 1400 may acquire phase difference data or a delay time using phase data of current that is applied to the holder and phase data of voltage that is applied to the holder. The phase data of the current and the phase data of the voltage are acquired from the sensing unit. The controller 1400 may generate the switching signal SW on the basis of the acquired phase difference data or delay time. Impedance of the holder may vary as the etching process proceeds. The controller 1400 may generate the switching signal SW corresponding to the varying impedance of the holder using the sensing unit. Thus, the controller 1400 may keep, at a predetermined level or higher, electric power that is supplied to the holder.

Although not illustrated in FIG. 4, the RF generator 1000 may include a memory. Various types of data may be stored in the memory. Various types of data may be stored temporarily or semi-permanently in the memory. Examples of the memory may include a Hard Disk Drive (HDD), a Solid State Drive (SSD), a Flash Memory, a Read-Only Memory (ROM), a Random Access Memory (RAM), and the like. The memory may be provided in a form that is embedded in the RF generator 1000 or in a form that is attachable thereto and detachable therefrom.

At least one of constituent elements of the RF generator 1000 described above may be omitted. For example, the RF generator 1000 does not include the power supply unit 1100, neither the rectifier 1200 or does not include one of the power supply unit 1100 and the rectifier 1200. The RF generate 1000 may be provided with direct-current power or rectified direct-current power from the outside.

A method in which the RF generator 1000 according to the embodiment of the present disclosure provides the bias power to the holder during the pulse-on period or the pulse-off period will be described in detail below with reference to FIGS. 5 to 7.

The pulse-on period may refer to a period for etching the substrate, and the pulse-off period may refer to a period for removing by-products generated as the etching is performed. Meanwhile, the pulse-on period is not limited to have literal meaning, such as a period in which a pulse is maintained or repeated continuously. Similarly, the pulse-off period is also not limited to have literal meaning, such as a period in which a pulse is not applied at all. In other words, the pulse-on period may be interpreted as a main processing period or an etching period (or a first period) in which etching for the substrate is performed as the bias power is provided in a specific manner. The pulse-off period, likewise, may be interpreted as an auxiliary processing period or a releasing period (or a second period) in which the by-products resulting from substrate etching are removed as the bias power in a specific manner. In particular, as will be described later, it may be understood that the bias power provided to the holder in the pulse-off period is not always at a low level (or high level), but has electric power equivalent to a low level (or equivalent to a high level).

Figure 5:
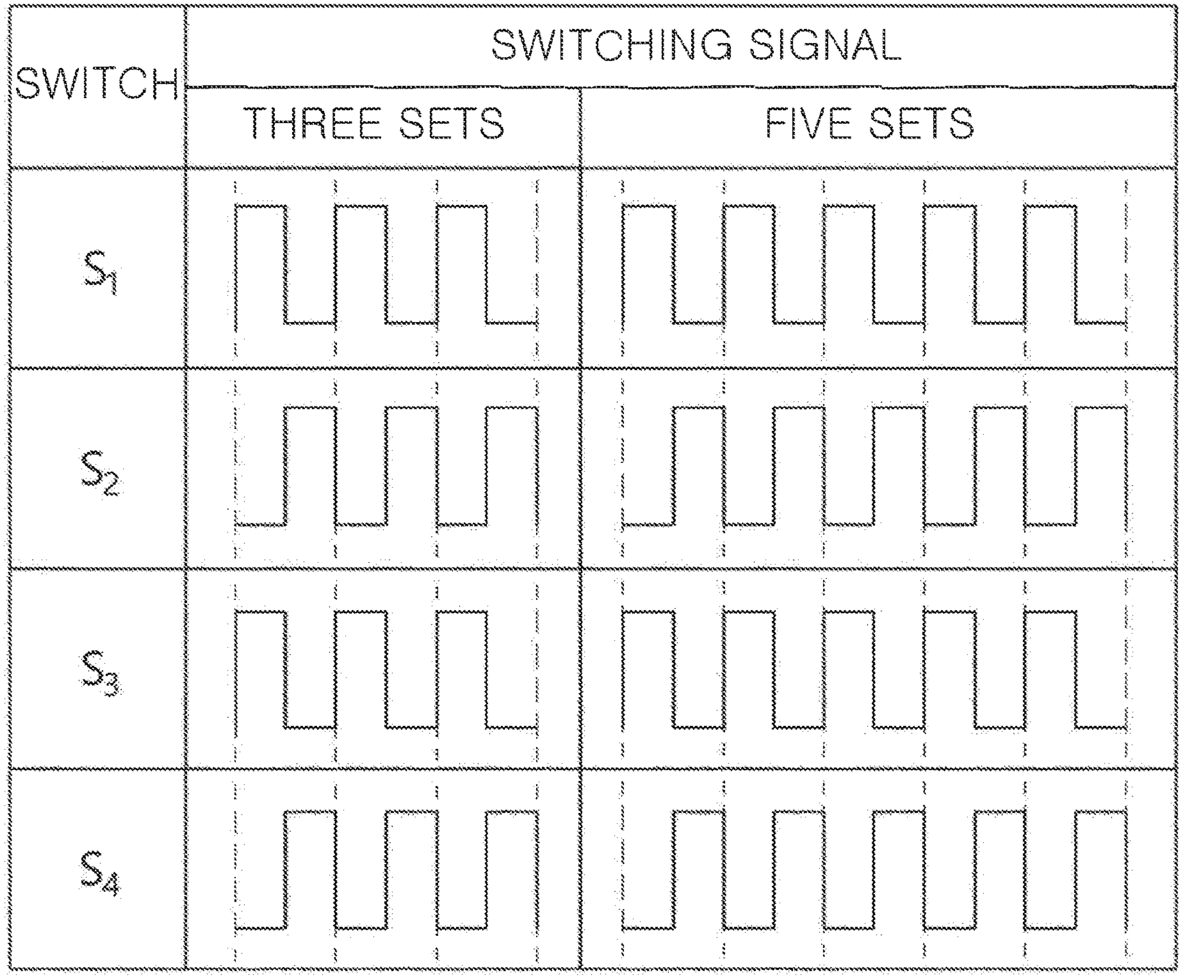
FIG. 5 is a view illustrating a switching signal that is provided to an inverter during a pulse-on period according to an embodiment of the present disclosure.

FIG. 5 is a view illustrating the switching signal SW that is provided to the inverter 1300 during the pulse-on period according to the embodiment of the present disclosure. During the pulse-on period, the RF generator 1000 may apply the bias power to the holder in such a manner that the etching is performed on the substrate.

During the pulse-on period, the RF generator 1000 may regularly apply the switch-on signal or the switch-off signal to the first to fourth S1, S2, S3, and S4) of the inverter 1300. For example, with reference to FIG. 5, the controller 1400 may apply the switch-off signal and the switch-on signal alternately to the second switch S2 and the fourth switch S4 while applying the switch-on signal and the switch-off signal alternately to the first switch S1 and the third switch S3. In other words, during the pulse-on period, the switching signals SW of the same type may be applied to the first switch S1 and the third switch S3, respectively. In addition, the switch signals SW of the same type may also be applied to the second switch S2 and the fourth switch S4, respectively. In addition, the switching signals SW of different types may be applied to the first switch S1 and the second switch S2, respectively. In this case, a positive voltage and a negative voltage may be applied alternately to the holder, and thus ions resulting from the plasma may collide with the substrate. Accordingly, the etching may be performed.

The RF generator 1000 may control the length of the pulse-on period. For example, the length of the pulse-on period may be changed according to the number of times that the controller 1400 applies the switching signal SW. Specifically, with reference to FIG. 5, the controller 1400 applies the switch-on signal to the first switch S1 and the third switch S3 and the switch-off signal to the second switch S2 and the fourth switch S4, and subsequently, applies the switch-off signal to the first switch S1 and the third switch S3 and the switch-on signal to the second switch S2 and the fourth switch S4. When the above operation is defined as providing one set of bias power to the holder, the length of the pulse-on period may be determined as a length corresponding to three sets or five sets if three sets or five sets of bias power are provided to the holder in the pulse-on period. The length of the pulse-on period is not limited to the three sets or the five sets. Of course, the length of the pulse-on period may be determined as a length that corresponds to n (n is an integer greater than or equal to 1) sets.

The length of the pulse-on period may be specified based on a frequency over which the controller 1400 applies the switch signal SW to the inverter 1300. For example, in a case where the controller 1400 provides the switching signal SW using a clock source having a clock frequency of 400 kHz, when three sets of bias power are applied to the holder, the length of the pulse-on period may be 7.5 μs (2.5 μs×3). In addition, in a case where five sets of bias power are applied to the holder, the length of the pulse-on period may be 12.5 μs (2.5 μs×5).

In a case where the pulse-on period is relatively lengthened, the by-product resulting from the etching may occur excessively, and thus the etching may be prevented. In other words, the by-product needs to be released after the etching of the substrate proceeds to some extent. Specifically, it is desirable that the length of the pulse-on period during which the etching is performed on the substrate is set to approximately 10 μs or shorter. Therefore, as described below, in a case where the controller 1400 provides the switching signal SW to the inverter 1300 using the clock source having a clock frequency of 400 kHz, bias power may be composed of three to five sets in order for the pulse-on period having a length of 10 μs or shorter. Furthermore, in a case where the controller 1400 uses the clock source having an arbitrary clock frequency of cf, the pulse-on period may be composed of $cf \times 10^{-5}$ sets or smaller sets.

The length of the pulse-on period may be controlled by adjusting the time for which the switching signal (SW) is applied to the inverter 1300, as well as by controlling a number of the set of bias power that is applied to the holder.

As described above, the efficiency in etching the substrate can be improved by controlling the pulse-on period in such a manner that the length thereof is shortened. As a result, an etching speed can be increased in the plasma etching process.

FIG. 6 is a view illustrating the switching operation that is performed by the controller 1400 according to the embodiment of the present disclosure. The controller 1400 may operate in such a manner that specific switching signals SW are applied to the first to fourth switches S1, S2, S3, and S4, respectively, of the inverter 1300.

With reference to FIG. 6, the controller 1400 may perform first to fourth switching operations.

The first switching operation may mean an operation in which a switch-on signal is applied to the first switch S1, a switch-off signal to the second switch S2, a switch-on signal to the third switch S3, and a switch-off signal to the fourth switch S4.

The second switching operation may mean an operation in which the switch-off signal is applied to the first switch S1, the switch-on signal to the second switch S2, the switch-off signal to the third switch S3, and the switch-on signal to the fourth switch S4.

The third switching operation may mean an operation in which the switch-on signal is applied to the first switch S1, the switch-off signal to the second switch S2, the switch-off signal to the third switch S3, and the switch-on signal to the fourth switch S4.

The fourth switching operation may mean an operation in which the switch-off signal is applied to the first switch S1, the switch-on signal to the second switch S2, the switch-on signal to the third switch S3, and the switch-off signal to the fourth switch S4.

The controller 1400 may perform a fifth switching operation in which the switch-off signal is applied to the first and fourth switches S1, S2, S3, and S4. Regarding operation of the controller 1400 during the pulse-off period, which will be described below, the fifth switching operation may be performed instead of the third switching operation or the fourth switching operation.

It may be understood that each of the switching operations of the controller 1400 are configured to provide a unit pulse. For example, it may be understood that the first switching operation provides a unit pulse with which a positive voltage is applied to the holder, that the second switching operation provides a unit pulse with which a negative voltage is applied to the holder, and that the third and fourth switching operations provide a unit pulse with which a voltage of 0 is applied to the holder. As described below, as with the pulse-on period, a length of the pulse-off period may also be controlled.

Figure 7:
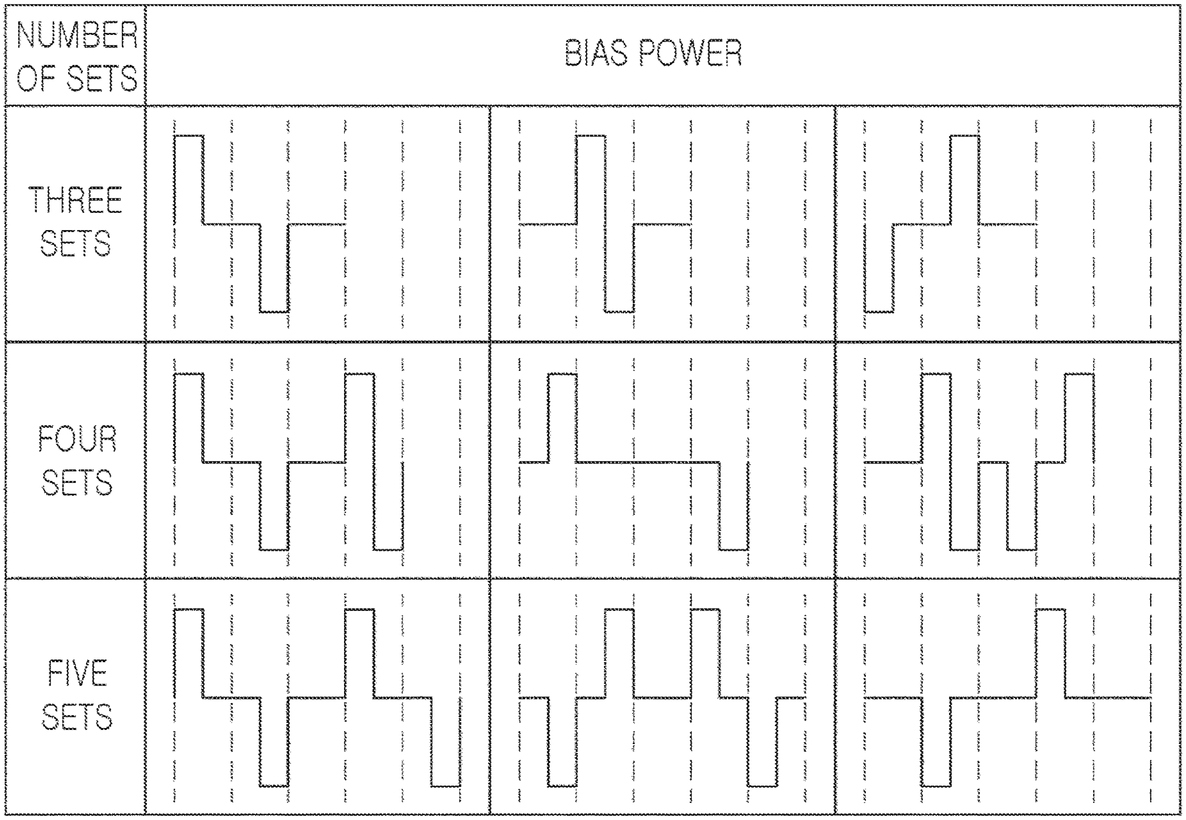
FIG. 7 is a view illustrating the bias power that is provided to a load by the inverter during a pulse-off period according to an embodiment of the present disclosure.

FIG. 7 is a view illustrating the bias power that is provided to a load by the inverter 1300 during the pulse-off period according to the embodiment of the present disclosure.

The controller 1400 may perform the above-described switching operations and thus may cause the inverter 1300 to provide the bias power to the holder.

During the pulse-off period, the bias power needs to have a magnitude corresponding to the low level. This is, as described above, for the by-product generated as the substrate is etched to be released during the pulse-off period. In order for the bias power to have the magnitude corresponding to the low level during the pulse-off period, the controller 1400 needs to perform the switching operation in such a manner as to satisfy at least one of the following rules.

Rule 1: During the pulse-off period, the first switching operation and the second switching operation are performed in a complementary manner. Specifically, during the pulse-off period, in a case where the first switching operation is performed x times, the second switching operation is also performed x times.

Rule 2: During the pulse-off period, the total amount of time that the third switching operation and/or the fourth switching operation are/is performed is half or more than half a length of the pulse-off period. In other words, during the pulse-off period, the sum of the time that the first switching operation is performed and the time that the second switching operation is performed is smaller than or equal to the total amount of time that the third switching operation and/or the fourth switching operation are/is performed.

Rule 3: During the pulse-off period, the total amount of time that the third switching operation or the fourth switching operation is performed between the first switching operation and the second switching operation is equal to the total amount of time that the third switching operation or the fourth switching operation is performed between the second switching operation and the first switching operation.

Rule 4: During pulse-off period, an operation first performed is the first switching operation, the third switching operation, or the fourth switching operation.

Rule 5: During the pulse-off period, the last operation performed is the second switching operation, the third switching operation, or the fourth switching operation.

Rule 6: During the pulse-off period, when the first switching operation is performed a plurality of times, at least the second switching operation is performed between the first switching operations.

Rule 7: During the pulse-off period, when the second switching operation is performed a plurality of times, at least the first switching operation is performed between the second switching operations.

The controller 1400 may be programmed in such a manner as to operate while satisfying at least one of Rules described above. The controller 1400 may realize the bias power by performing the switching operation in compliance with Rules described above. Thus, the inverter 1300 can be prevented from being damaged. Specifically, the controller 1400 may perform the switching operation in compliance with Rules described above, and switches within the inverter 1300 may operate accordingly in a manner of soft switching. Thus, the switches can be prevented from being damaged. Furthermore, the compliance with Rules described above ensures that negative and positive values of current that, for a predetermined time, flows through an inductive element additionally that may be included in the inverter 1300 are kept balanced. Thus, it is possible that the switching operations can be performed smoothly.

With reference to FIG. 7, the controller 1400 may realize the bias power to be applied to the holder by performing the switching operation in compliance Rules described above.

Specifically, the controller 1400 may sequentially perform the first switching operation, the third switching operation, the third switching operation, the second switching operation, the fourth switching operation, and the fourth switching operation, and thus provide bias power having three sets to the holder. The bias power realized as a result of complying with Rules described above is not limited to forms illustrated in FIG. 7. Of course, the bias power may be realized in various ways. For example, the controller 1400 may provide the bias power to the holder by performing only the third switching operation, the fourth switching operation, or a combination thereof.

As described above, during the pulse-off period, the bias power may be applied to the holder by performing the switching operation. Thus, a process of releasing the by-product can be controlled in a more precise manner. The time consumed for releasing the by-product resulting from the etching may change as the time elapses after the process of the etching starts in the plasma etching process. Specifically, the more increased the etch depth, the strongly a sticking effect acts. The sticking effect refers to a phenomenon where the by-product collides with a wall of an etching hole when released. Accordingly, the time consumed for releasing the by-product can be increased.

In this manner, the RF generator 1000 may control the bias power to be applied to the holder in a manner that corresponds to a case where the time necessary for releasing the by-product changes. A method in which the RF generator 1000 controls the bias power to be provided to a load in order to optimize the above-mentioned process of releasing the by-product will be described in detail below.

Figure 8:
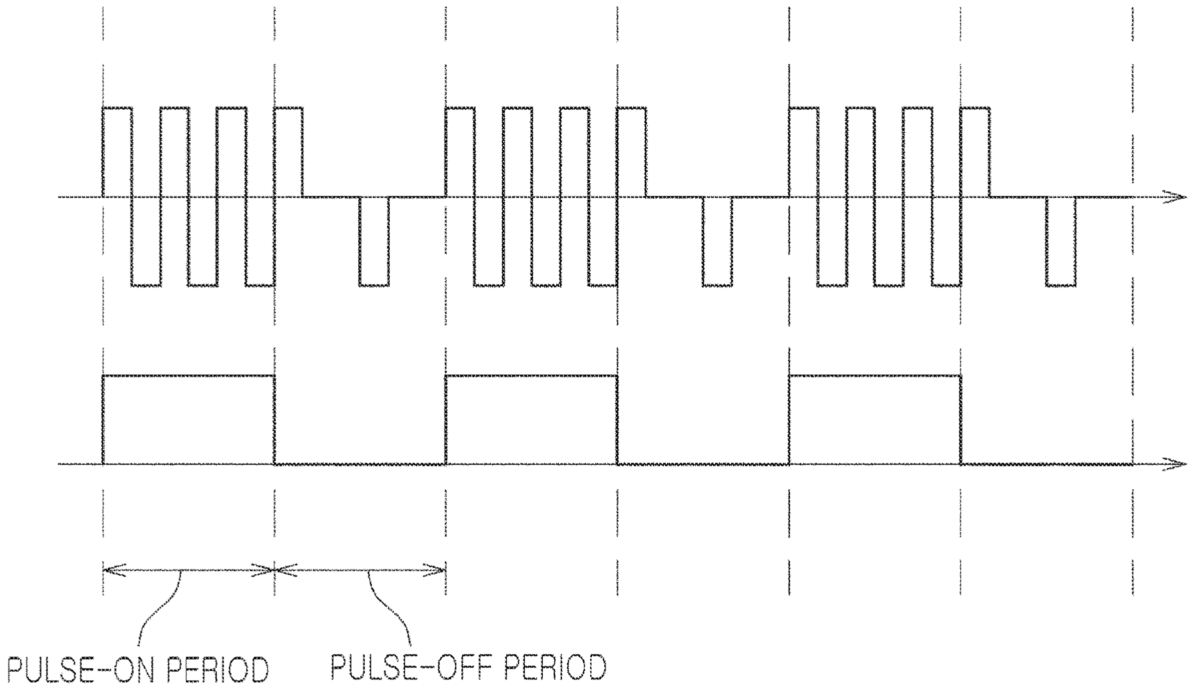
FIG. 8 is a view illustrating the bias power that is provided by an RF generator to the load during a pulse-on period and a pulse-off period according to an embodiment of the present disclosure.

FIG. 8 is a view illustrating the bias power that is provided by the RF generator 1000 to the load during the pulse-on period and the pulse-off period according to the embodiment of the present disclosure.

With reference to FIG. 8, during the pulse-on period, the RF generator 1000 may provide the bias power corresponding to the high level to the holder. Specifically, during the pulse-on period, the RF generator 1000 may continuously provide electric power at a predetermined level or higher (or per-unit electric power at a predetermined level or higher) to the holder. In other words, during the pulse-on period, the bias power may be understood as a high-level signal for etching the substrate. Thus, the etching may be continuously performed on the substrate.

With reference to FIG. 8, during the pulse-off period, the RF generator 1000 may provide the bias power corresponding to the low level to the holder. Specifically, during the pulse-off period, the RF generator 1000 may continuously provide electric power at a predetermined level or lower (per-unit time electric power at a predetermined level or lower) to the holder. In other words, during the pulse-off period, the bias power may be understood as a low-level signal for releasing the by-product. Thus, the by-product may be continuously induced to be released.

During the pulse-on period and the pulse-off period, the bias power may be realized based on the switching signal and the switching operation that are described with reference to FIGS. 5 to 7.

With reference to FIG. 8, during the pulse-on period, bias power may be realized with three sets, and each set may be configured with a unit pulse indicating a positive voltage and a unit pulse indicating a negative voltage. In addition, during the pulse-off period, bias power may be realized with three sets, and the controller 1400 may realize the bias power of three sets by performing the first switching operation, the third switching operation, the third switching operation, the second switching operation, the fourth switching operation, and the fourth switching operation. Consequently, the pulse-on period and the pulse-off period may be repeated, and thus the bias power having a specific period may be applied to the holder.

Lengths of the pulse-on period and the pulse-off period, as described above, may be adjusted, and the period of the bias power may also be adjusted accordingly. For example, in a case where the pulse-on period and the pulse-off period each have a length corresponding to three sets (the length is approximately 7.5 μs when a clock source having a clock frequency of 400 kHz is used), the bias power may have a period corresponding to six sets (the period is approximately 15 μs when a clock source having a clock frequency of 400 kHz is used). As another example, in a case where the pulse-on period and the pulse-off period each have a length corresponding to five sets (the length is approximately 12.5 μs when a clock source having a clock frequency of 400 kHz is used), the bias power may have a period corresponding to 10 sets (the period is approximately 25 μs when a clock source having a clock frequency of 400 kHz is used).

The pulse-on period and the pulse-off period may have different lengths. For example, the period of the pulse-on period is longer than the length of the pulse-off period. Specifically, the pulse-on period may have a length corresponding to five sets, and the pulse-off period may have a length corresponding to three sets. As another example, the length of the pulse-on period may be shorter than the length of the pulse-off period. Specifically, the pulse-on period may have a length corresponding to three sets, and the pulse-off period may have a length corresponding to five sets.

By controlling, as described above, the lengths of the pulse-on period and the pulse-off period to be relatively short, etching could be performed only until the by-product resulting from the etching interferes the etching, and it is possible to reduce time that unnecessarily elapses after most of the by-product is released. In the related art, a matching network is necessarily included since equipment damage can be occurred due to the overshoot and undershoot when the matching network is not present. However, in a case where the matching network is used, as described above, due to the rising time and the falling time, it is difficult to realize the pulse-on period or the pulse-off period in such a manner that the length thereof is shortened. In contrast, the RF generator 1000 according to the embodiment of the present disclosure may variably control the driving frequency without using the matching network. Thus, there is provided a remarkable advantage in that the pulse-on period and the pulse-off period are set in such a manner that the lengths thereof are relatively shortened without causing switch damage.

In addition to performing the method of shortening the lengths of the pulse-on period and the pulse-off period, the bias power to be applied to the holder may be controlled with the passage of time in order to improve the etching speed in the etching process.

The method of controlling the bias power to be applied to the holder with the passage of time in the plasma etching process will be described in detail below with reference to FIGS. 9 and 10.

Figure 9:
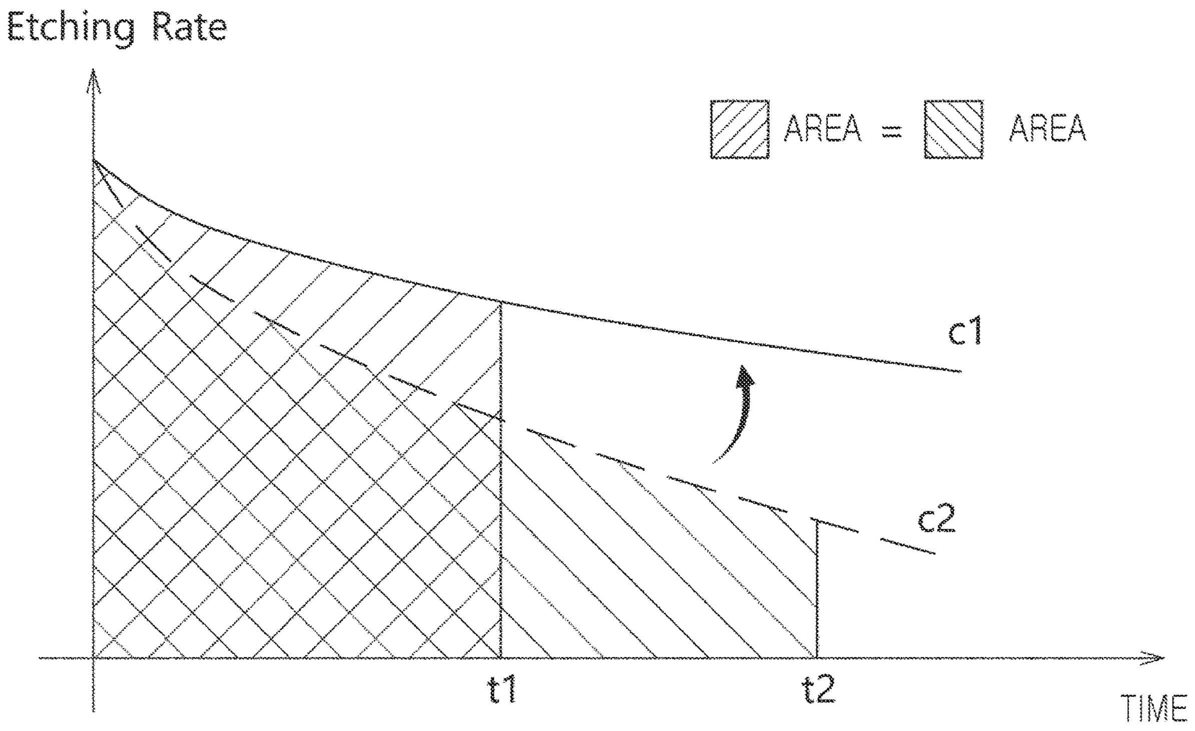
FIG. 9 is a view illustrating bias power that is provided to a load in such a manner as to prevent a decrease in an etching speed over time according to an embodiment of the present disclosure.

With reference to FIG. 9, the RF generator 1000 may repeat a first cycle that is composed of a first pulse-on period and a first pulse-off period and thus may apply the bias power. When a predetermined time elapses from a starting time point of the etching process, the RF generator 1000 may repeat a second cycle that is composed of a second pulse-on period and a second pulse-off period, and thus may apply the bias power to the holder.

A length of the second cycle may be longer than a length of the first cycle. For example, in a state where the length of the second pulse-on period is kept the same as the length of the first pulse-on period, the length of the second pulse-off period may be longer than the length of the first pulse-off period. As another example, the length of the second pulse-on period may be longer than the length of the first pulse-on period, and the length of the second pulse-off period may be longer than the length of the first pulse-off period. As another example, the length of the second pulse-on period may be shorter than the first pulse-on period, and the length of the second pulse-off period may be longer than the length of the first pulse-off period. The lengths here of the pulse-off period and/or the pulse-on period, as described above, may be controlled by changing the number of sets of bias power.

Although not illustrated in FIG. 9, the RF generator 1000 may apply the bias power to the holder by repeating the first cycle, repeating the second cycle after a first elapse time elapses from the starting time point of the etching process, and repeating a third cycle after a second elapse time elapses from the starting time point of the etching process. At this point, a length of the third cycle could be longer than the length of the second cycle as in the context in which, as described above, the length of the second cycle is controlled based on the first cycle. Of course, the method in which the RF generator 1000 applies the bias power to the holder is not limed to using the above-described first to third cycles. The RF generator 1000 may provide the bias power to the holder by repeating a plurality of cycles having different lengths.

When the bias power is provided, the cycle may be controlled according to the etch depth. For example, in a case where the etch depth is at or above a predetermined value, the lengths of the pulse-on period and/or the pulse-off period may be increased. At this point, the RF generator 1000 may include a sensor for measuring the etch depth or may be provided in real time with data on the etch depth from an external sensor.

As described above, in the etching process, by controlling the period and the duty cycle of the bias power to be applied to the holder according to the time that elapses from the starting time point of the etching in the etching process, it is possible to actively respond to the etch depth varying with time. As a result, the time taken for the etching process can be greatly reduced as the etching speed is increased.

Figure 10:
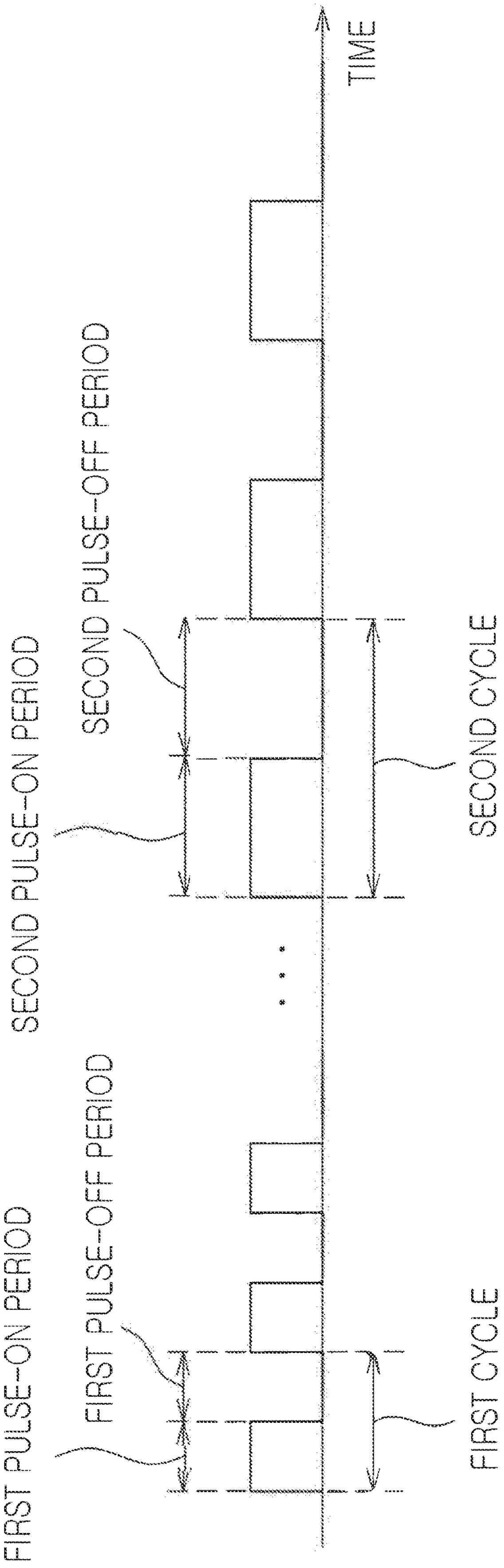
FIG. 10 is a view representing an etching speed over time according to an embodiment of the present disclosure.

Specifically, as illustrated in FIG. 10, the etching speed can be reduced with the passage of time. The reason for this is that the etch depth is getting deeper with the etching for the substrate is performed and a distance which the by-product needs to move for being released increases, so that time for the by-product being released increases. At this point, if the bias power having a predetermined waveform or period (or invariable waveform or period) is used, the etching speed can be decreased since the etching may be performed in a state where the by-product is not sufficiently released as time goes by.

In addition, the total amount of time taken for the etching process may vary according to the extent of occurrence of the phenomenon, where the etching speed is decreased over time. With reference to FIG. 10, when comparing a first etching speed curve c1 and a second etching speed curve c2, first time t1 may be taken in the first etching speed curve c1, and second time t2 longer than first time may be taken in the second etching speed curve c2 when the substrates are etched to the same depth. Therefore, for a rapid etching process, as indicated by the first etching speed curve c1, there is a need to decrease the extent to which the etching speed is decreased over time.

With the method of controlling the bias power described with reference to FIG. 9, it is possible to move the etching speed curve from the second etching speed curve c2 to the direction of the first etching speed curve c1 illustrated in FIG. 10. In other words, the time taken for the etching process and the time taken to release the by-product may be optimized over the entire course of performing the etching process, and the time taken for the etching process can be greatly reduced.

The method according to the embodiment may be realized in the form of program commands executable through various types of computers. Thus, the resulting program commands may be recorded on a computer-readable recording medium. The computer-readable recording medium may include a program command, a data file, a data structure, and the like, independently or in combination. The program command recorded on the computer-readable recording medium is specially designed and configured for the embodiment, or is known to a person of ordinary skill in the art to which a computer software pertains and thus is available for use. Examples of computer-readable recording medium include magnetic media, such as a hard disk, a floppy disk, and a magnetic tape, optical recording media, such as a CD-ROM and a DVD drive, magnetic-optical media, such as a floptical disk, and hardware devices, such as a ROM, a RAM, and a flash memory, which are specially configured to store and perform a program command. Examples of the program command include machine language codes, such as ones generated by a compiler, and high-level language codes executable by a computer using an interpreter and the like. The above-described hardware device may be configured in such a manner as to operate as one or more software modules in order to operate the operation according to the embodiment, and vice versa.

The embodiments, although restricted in number, is described above with reference to the accompanying drawings. Various modifications and amendments are possibly made to the embodiments by a person of ordinary skill in the art to which the present disclosure pertains. For example, substantially the same result can be achieved although the technologies described above are implemented in a different order than in the above-described method, and/or although constituent elements of the system, the structure, the apparatus, the circuit, and the like that are described above are connected or combined in a different form than in the above-described method or each thereof is replaced with a different constituent element or equivalent.

Therefore, any other embodiment and equivalent belong to the scope of the present disclosure that is claimed in the following claims.

What is claimed is:

1. A system for semiconductor etching process, comprising:

a substrate holder including an RF electrode; and a frequency generator electrically interposed between the RF electrode of the substrate holder and ground node and configured to provide pulsed bias voltage to the RF electrode, the frequency generator comprising:

a power source, an inverter comprising at least one transistor, the inverter being configured to receive DC power from the power source and provide positive pulsed bias voltage or negative pulsed bias voltage to the RF electrode, and a controller configured to:

provide a control signal to the at least one transistor of the inverter to alternately apply the positive pulsed bias voltage and the negative pulsed bias voltage to the RF electrode with a predetermined frequency during a pulse-on period such that ions are accelerated toward a substrate and collide with the substrate for etching processing when the substrate holder supports the substrate, and provide a control signal to the at least one transistor of the inverter to apply the positive pulsed bias voltage, the negative pulsed bias voltage and no bias voltage to the RF electrode during a pulse-off period such that etching-byproducts are released from the substrate when the substrate holder supports the substrate, wherein a total number of the positive pulses and the negative pulses during the pulse-off period is fewer than a total number of the positive pulses and the negative pulses during the pulse-on period.

2. The system of claim 1, wherein the inverter further comprises a first transistor, a second transistor, a third transistor, and a fourth transistor, wherein a first node is defined as a node between the first transistor and the second transistor which are connected to each other in series, and a second node is defined as a node between the third transistor and the fourth transistor which are connected to each other in series, and wherein the controller is configured to control the first, second, third and fourth transistors so as to generate potential difference between the first node and the second node, thereby providing the positive pulses and/or the negative pulses to the electrode.

3. The system of claim 2, wherein the controller is configured to perform:

a first switching operation that provides a first switch-on signal to the first transistor and the third transistor and that provides a first switch-off signal to the second transistor and the fourth transistor, a second switching operation that provides a second switch-off signal to the first transistor and the third transistor and that provides a second switch-on signal to the second transistor and the fourth transistor, a third switching operation that provides a third switch-on signal to the first transistor and the fourth transistor and that provides a third switch-off signal to the second transistor and the third transistor, or a fourth switching operation that provides a fourth switch-off signal to the first transistor and the fourth transistor and that provides a fourth switch-on signal to the second transistor and the third transistor.

4. The system of claim 3,
wherein the controller is configured to:
perform the first switching operation and the second switching operation alternatively during the pulse-on period,
perform at least one of the third switching operation or the fourth switching operation during at least part of the pulse-off period, and
control the inverter such that the pulse-on period and the pulse-off period are alternatively repeated,
wherein a total time that at least one of the third switching operation or the fourth switching operation is performed during the pulse-off period is equal to or more than half of a length of the pulse-off period.

5. The system of claim 4,
wherein a total time that the first switching operation is performed during the pulse-off period is same to that of the second switching operation performed during the pulse-off period.

6. The system of claim 1,
wherein a length of the pulse-on period and a length of the pulse-off period are same.

7. The system of claim 1,
wherein a length of the pulse-off period is shorter than a length of the pulse-on period.

8. The system of claim 1,
wherein the controller is configured to control the inverter such that a length of the pulse-off period increases after a predetermined time from a starting time of etching process on the substrate.

9. The system of claim 1, further comprising:
a sensor configured to detect an extent of etching on the substrate,
wherein the controller is configured to
obtain etch depth information from the sensor, and
when it is determined that an etch depth is more than a predetermined depth based on the etch depth information, control the inverter such that a length of the pulse-off period increases.

10. The system of claim 1, further comprising:
a chamber within which the substrate holder is placed; and
a radio frequency (RF) source configured to generate a plasma inside the chamber.

11. The system of claim 1,
wherein a length of at least one of the pulse-on period or the pulse-off period is less than 30 microseconds.

12. The system of claim 1,
wherein each of a length of pulse-on period and a length of pulse-off period is less than 10 microseconds.

* * * * *